(12) United States Patent
Kang

(10) Patent No.: US 8,409,956 B1
(45) Date of Patent: Apr. 2, 2013

(54) METHODS OF FORMING INTEGRATED CIRCUIT DEVICES USING SELF-ALIGNED CONTACT FORMATION TECHNIQUES

(75) Inventor: Hong Seong Kang, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/283,183

(22) Filed: Oct. 27, 2011

(51) Int. Cl.
H01L 21/336 (2006.01)
(52) U.S. Cl. .. 438/279; 438/586; 438/639; 257/E21.578
(58) Field of Classification Search ................. 438/279, 438/586, 627, 637, 639; 257/E21.577, E21.578
See application file for complete search history.

(56) References Cited

U.S. PATENT DOCUMENTS

| | | | |
|---|---|---|---|
| 6,140,705 A * | 10/2000 | Liu | 257/774 |
| 6,228,731 B1 * | 5/2001 | Liaw et al. | 438/303 |
| 6,369,430 B1 * | 4/2002 | Adetutu et al. | 257/382 |
| 6,649,490 B1 | 11/2003 | Lee et al. | |
| 6,649,503 B2 * | 11/2003 | Kim et al. | 438/595 |
| 6,649,508 B1 | 11/2003 | Park et al. | |
| 6,818,551 B2 | 11/2004 | Jin et al. | |
| 6,870,268 B2 | 3/2005 | Lee et al. | |
| 6,881,659 B2 | 4/2005 | Park et al. | |
| 7,259,083 B2 * | 8/2007 | Menon et al. | 438/586 |
| 7,326,613 B2 | 2/2008 | Yun et al. | |
| 7,397,130 B2 | 7/2008 | Lee | |
| 7,547,938 B2 | 6/2009 | Yun et al. | |
| 7,875,551 B2 | 1/2011 | Lee et al. | |
| 2010/0224936 A1 * | 9/2010 | Hokazono | 257/368 |

FOREIGN PATENT DOCUMENTS

| | | |
|---|---|---|
| KR | 1020020056206 A | 7/2002 |
| KR | 1020050015109 A | 2/2005 |
| KR | 1020050038469 A | 4/2005 |

\* cited by examiner

*Primary Examiner* — Tuan N. Quach
(74) *Attorney, Agent, or Firm* — Myers Bigel Sibley & Sajovec, P.A.

(57) ABSTRACT

Methods of forming integrated circuit devices include forming first and second gate electrodes at side-by-side locations on a substrate and forming first and second sidewall spacers on sidewalls of the first gate electrode and the second gate electrode, respectively. The first and second gate electrodes are covered with a first electrically insulating layer of a first material. A second electrically insulating layer of a second material is deposited on the first electrically insulating layer. The second electrically insulating layer is patterned to define a first opening therein that exposes an underlying first portion of the first electrically insulating layer.

11 Claims, 4 Drawing Sheets

METHODS OF FORMING INTEGRATED CIRCUIT DEVICES USING SELF-ALIGNED CONTACT FORMATION TECHNIQUES

FIELD OF THE INVENTION

The present invention relates to methods of forming integrated circuit devices and, more particularly, to methods of forming integrated circuit devices using self-aligned contact techniques.

BACKGROUND OF THE INVENTION

Techniques to form more highly integrated circuits frequently utilize photolithographically-defined patterning steps to define circuit features having reduced lateral dimensions. However, because the tolerances associated with photolithographic alignment steps do not necessarily scale downward with the continued reductions in lateral dimensions of current state-of-the-art integrated circuit devices, the formation of contact holes during back-end processing steps may cause unacceptably high rates of failure and unacceptably low yields when chips embodying the integrated circuit devices are tested. This is particularly true in fabrication techniques requiring the formation of relatively high aspect ratio contact holes, which are to be filled with electrical interconnects. As will be understood by those skilled in the art, even slight deviations in photolithographic alignment may cause formation of electrical shorts between electrical interconnects in relatively deep contact holes and surrounding active and passive device structures, including multi-level wiring.

One example of a contact formation technique having self-aligned characteristics is disclosed in U.S. Pat. No. 7,875,551 to Lee et al., entitled "Methods of Forming Integrated Circuit Devices Using Contact Hole Spacers to Improve Contact Isolation," the disclosure of which is hereby incorporated herein by reference. Another example of a contact formation technique having self-aligned characteristics is disclosed in U.S. Pat. No. 6,881,659 to Park et al., entitled "Methods of Forming Self-Aligned Contact Structures in Semiconductor Integrated Circuit Devices," the disclosure of which is hereby incorporated herein by reference.

SUMMARY OF THE INVENTION

Methods of forming integrated circuit devices according to embodiments of the invention include forming first and second gate electrodes at side-by-side locations on a substrate and forming first and second sidewall spacers on sidewalls of the first gate electrode and the second gate electrode, respectively. The first and second gate electrodes are covered with a first electrically insulating layer of a first material (e.g., silicon dioxide). A second electrically insulating layer of a second material (e.g., silicon nitride) is deposited on the first electrically insulating layer. The second electrically insulating layer is patterned to define a first opening therein that exposes an underlying first portion of the first electrically insulating layer. The first portion of the first electrically insulating layer is selectively etched to define a second opening therein that exposes a first portion of the substrate, a first sidewall spacer on the first gate electrode and a second sidewall spacer on the second gate electrode, using the second electrically insulating layer as an etching mask. Thereafter, sidewalls of the first and second openings, the first and second sidewall spacers and the exposed first portion of the substrate are conformally lined with an electrically insulating protective layer of the second material. A portion of the deposited electrically insulating protective layer is then removed from between the first and second gate electrodes to expose the first portion of the substrate. The second opening and at least a portion of the first opening are then filled with an electrically conductive material.

According to some embodiments of the invention, the step of selectively etching the first portion of the first electrically insulating layer includes etching the first portion of the first electrically insulating layer to define a second opening therein that exposes an upper surface of the second gate electrode. Moreover, the step of lining may include depositing the electrically insulating protective layer onto the exposed upper surface of the second gate electrode.

According to still further embodiments of the invention, the step of filling the second opening includes filling the second opening and the first opening with a metal interconnect that contacts the first portion of the substrate. An additional step may also be performed to form a source/drain diffusion region in the substrate, between the first and second gate electrodes. The step of filling may also include filling the second opening and the first opening with a metal interconnect that contacts the source/drain diffusion region.

Additional embodiments of the invention may include implanting first source and drain region dopants into the substrate using the first and second gate electrodes as an implant mask, before forming first and second sidewall spacers. The step of covering the first and second gate electrodes may be preceded by implanting second source and drain region dopants into the substrate using the first and second gate electrodes and the first and second sidewall spacers as an implant mask.

Methods of forming integrated circuit devices according to still further embodiments of the invention include forming a gate electrode on a substrate and forming sidewall spacers on opposing sidewalls of the gate electrode. The gate electrode is covered with a first electrically insulating layer of a first material before a second electrically insulating layer of a second material is deposited on the first electrically insulating layer. The second electrically insulating layer is patterned to define a first opening therein that exposes a first portion of the first electrically insulating layer. A selective etching step is then performed on the first portion of the first electrically insulating layer to thereby define a second opening therein that exposes an upper surface of the gate electrode. This selective etching step uses the patterned second electrically insulating layer as an etching mask. Sidewalls of the first and second openings and the upper surface of the gate electrode are then lined with an electrically insulating protective layer comprising the second material. A portion of the electrically insulating protective layer in the second opening is then removed to expose the upper surface of the gate electrode. The second opening and at least a portion of the first opening is then filled with an electrically conductive material that contacts the upper surface of the gate electrode. The removing step may also include etching the electrically insulating protective layer to form protective spacers on sidewalls of the first opening in the second electrically insulating layer. The filling step may include filling the second opening and the first opening with a metal interconnect that contacts the upper surface of the gate electrode. The step of forming sidewall spacers on the gate electrode may be preceded by a step of implanting first source and drain region dopants into the substrate using the gate electrode as an implant mask. The step of covering the gate electrode may be preceded by implanting second source and drain region dopants into the substrate using the gate electrode and the sidewall spacers as an implant mask.

DETAILED DESCRIPTION OF EMBODIMENTS

Figure 1A:
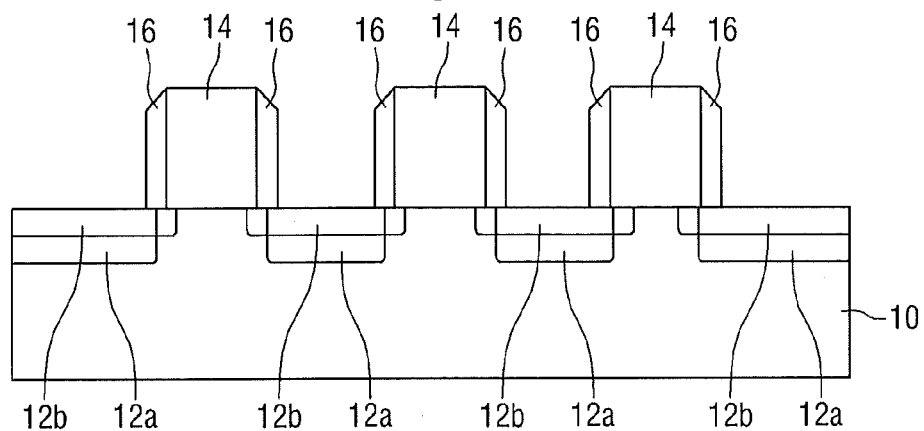
FIGS. 1A-1H are cross-sectional views of intermediate structures that illustrate methods of forming integrated circuit devices according to embodiments of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIGS. 1A-1H, methods of forming integrated circuit devices according to embodiments of the invention utilize self-aligned contact formation techniques as described herein. As illustrated by FIG. 1A, these methods include forming a plurality of gate electrodes 14 at side-by-side locations on an integrated circuit substrate 10. These gate electrodes 14, which may be formed as insulated gate electrodes that are suitable with metal-oxide-semiconductor (MOS) fabrication technologies, can include a composite of a gate insulating layer, an electrically conductive gate (e.g., polysilicon gate) on the gate insulating layer and a silicide contact layer on the electrically conductive gate, for example. The integrated circuit substrate 10 may be a semiconductor substrate or a semiconductor-on-insulator (SOI) substrate having a semiconductor region therein, for example. Lightly doped and relatively shallow source/drain (LDD) diffusion regions 12b may also be formed by implanting source/drain region dopants at a first dose and first energy level into the substrate 10, using the gate electrodes 14 as an implant mask. For example, in the event the illustrated integrated circuit devices are N-channel MOS transistors, N-type source/drain region dopants (e.g., phosphorus) may be implanted into the substrate 10 using, for example, a halo-implant technique. Thereafter, sidewall spacers 16 (e.g., nitride spacers) may be formed on opposing sidewalls of the gate electrodes 14, as illustrated, by performing a conformal deposition of an insulating spacer layer (e.g., nitride layer) followed by an etch-back step to remove portions of the deposited spacer layer from upper surfaces of the gate electrodes 14 and an upper surface of the substrate 10. More highly doped and relatively deep source/drain diffusion regions 12a may then be formed by implanting source/drain region dopants at a second dose and second energy level into the substrate 10, using the gate electrodes 14 and sidewall spacers 16 collectively as an implant mask. These steps of implanting source/drain region dopants may be followed by a thermal annealing step(s) to thereby drive-in and activate the implanted dopants.

Figure 1B:
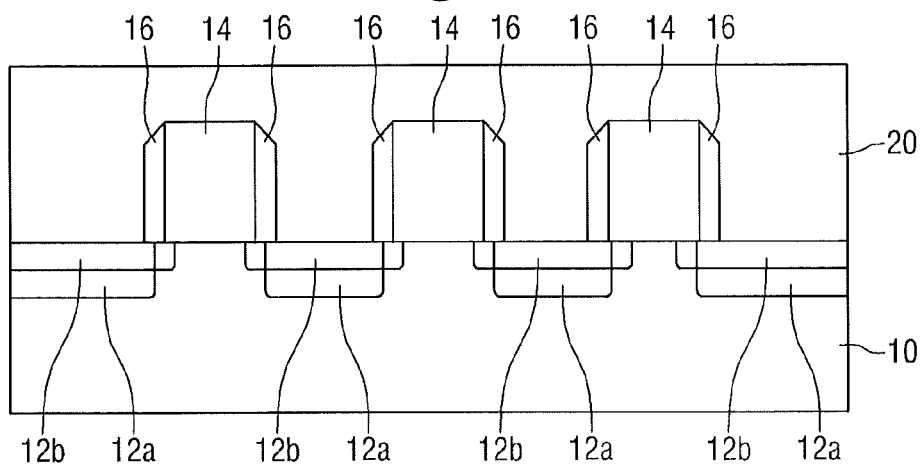
Figure 1C:
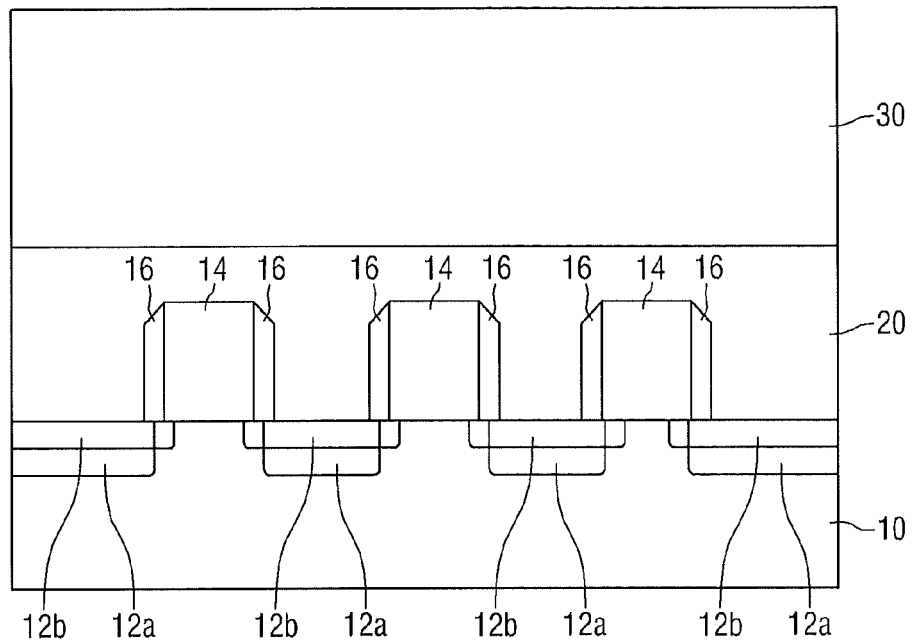

Referring now to FIGS. 1B-1C, the gate electrodes 14 and sidewall spacers 16 are covered with a first electrically insulating layer 20 of a first material (e.g., silicon dioxide) having an etching selectively with respect to the sidewall spacers 16. This first electrically insulating layer 20 may having a relatively planar upper surface achieved by conformally depositing a layer of the first material on the gate electrodes 14 and then chemically-mechanically polishing (CMP) the deposited layer to yield the first electrically insulating layer 20. Thereafter, as illustrated by FIG. 1C, a second electrically insulating layer 30 of a second material (e.g., silicon nitride) is deposited on the first electrically insulating layer 20. The second material is preferably chosen to have an etching selectivity relative to the first material during subsequent processing steps.

Figure 1D:
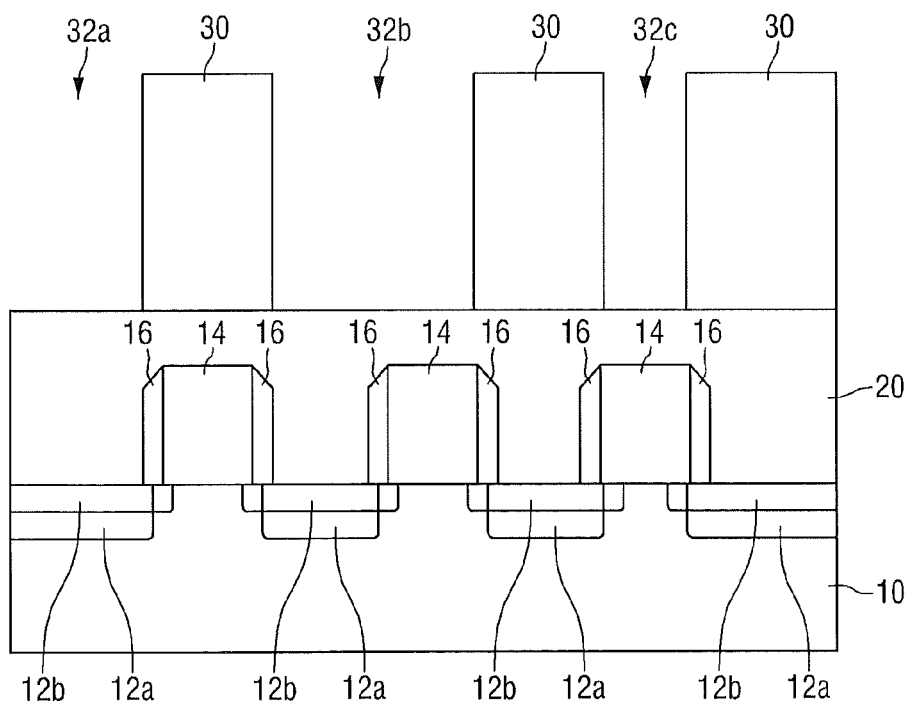
Figure 1E:
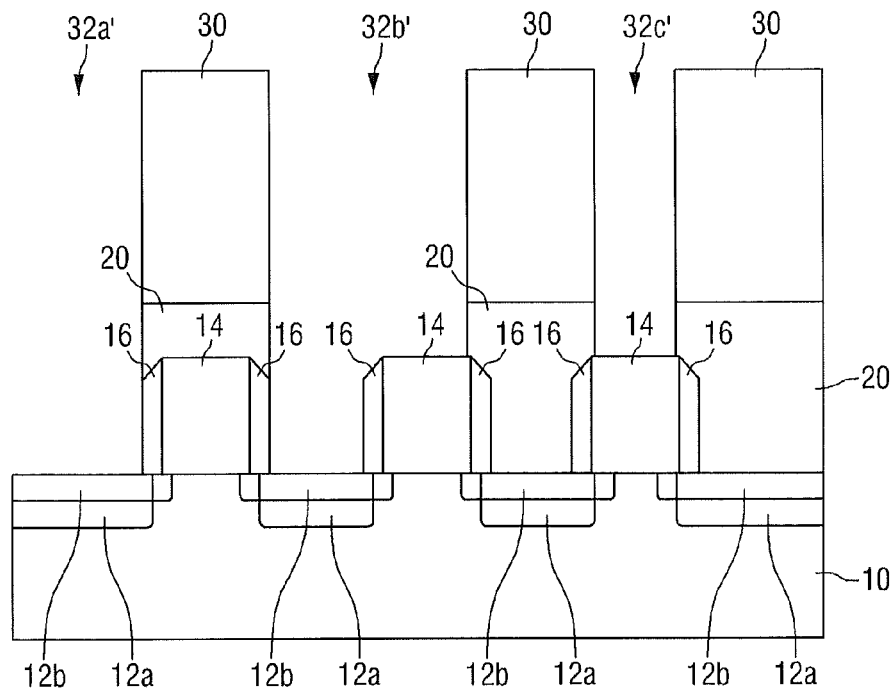

Referring now to FIG. 1D, a photolithographically-defined etching step using a photoresist mask (not shown) is performed to define a plurality of first openings 32a-32c in the second electrically insulating layer 30, which expose respective first portions of the first electrically insulating layer 20. Thereafter, as illustrated by FIG. 1E, the exposed first portions of the first electrically insulating layer 20 are selectively etched to define second openings 32a'-32b' therein that expose first portions (e.g., source/drain regions 12a/12b) of the substrate 10 and the sidewall spacers 16 and second openings 32b'-32c' that expose corresponding upper surfaces of the gate electrodes 14. This selective etching step uses the patterned second electrically insulating layer 30 as an etching mask.

Figure 1F:
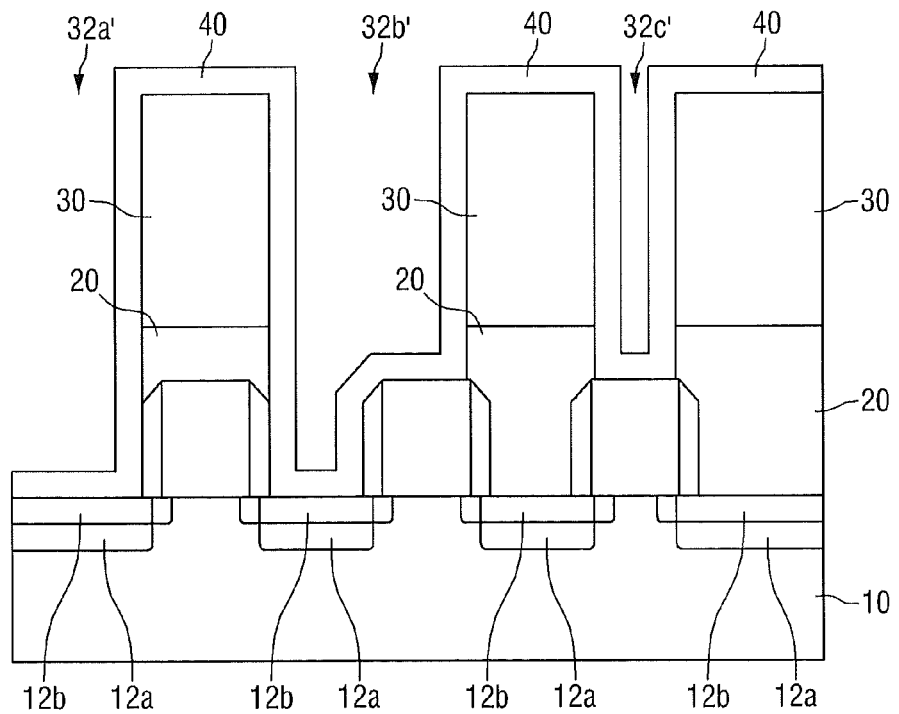
Figure 1G:
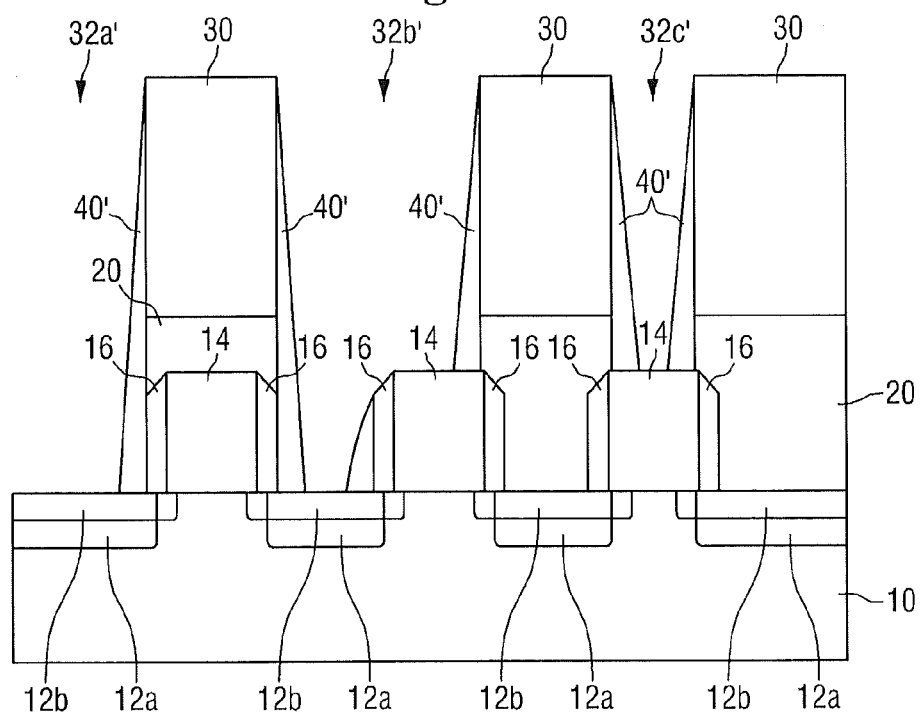
Figure 1H:
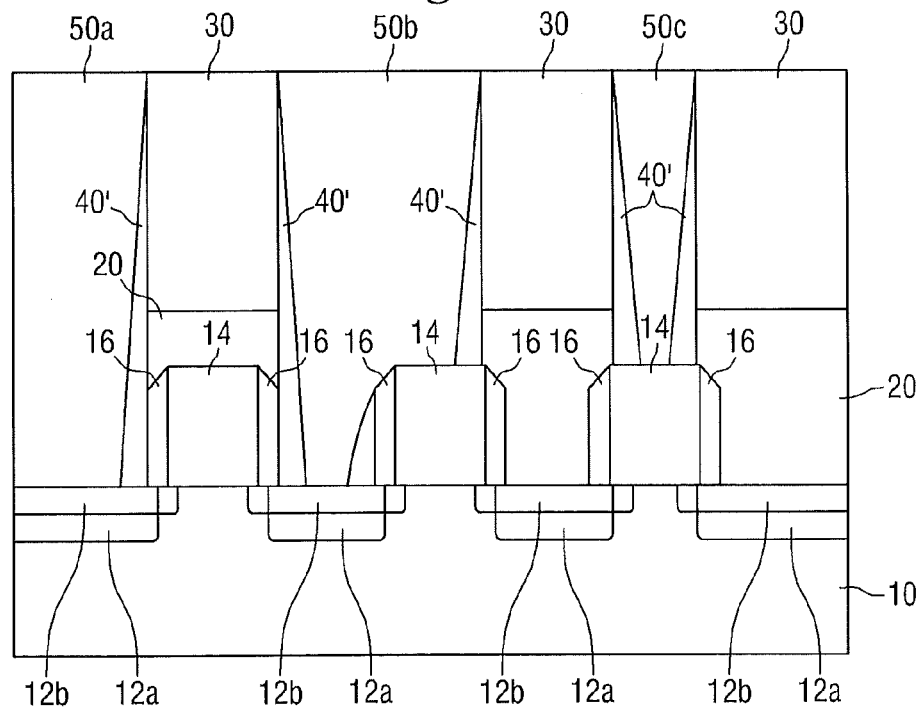

Thereafter, as illustrated by FIG. 1F, sidewalls of the first and second openings 32a-32c and 32a'-32c', the sidewall spacers 16, the exposed portions of the substrate 10 and the exposed upper surfaces of the gate electrodes 14 are conformally lined with an electrically insulating protective layer 40 of the second material. Portions of this electrically insulating protective layer 40 are then selectively removed to expose portions of the substrate 10 and portions of the upper surfaces of the gate electrodes 14, as illustrated by FIG. 1G, and yield self-aligned sidewall spacers 40' in the openings 32a'-32c'. These openings are then filled with an electrically conductive material (e.g., metal), which is then planarized to yield respective interconnects 50a-50c, as illustrated by FIG. 1H. These electrical interconnects 50a-50c provide increased yield by virtue of the presence of the sidewall spacers 40', which operate to compensate for deviations in photolithographic alignment during formation of the openings 32a-32c and 32a'-32c' by providing an additional degree of electrical isolation between laterally displaced structures adjacent the substrate 10.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising:

forming first and second gate electrodes at side-by-side locations on a substrate;

forming first and second sidewall spacers on sidewalls of the first gate electrode and the second gate electrode, respectively;

covering the first and second gate electrodes with a first electrically insulating layer of a first material;

depositing a second electrically insulating layer of a second material on the first electrically insulating layer;

patterning the second electrically insulating layer to define a first opening therein that exposes a first portion of the first electrically insulating layer;

selectively etching the first portion of the first electrically insulating layer to define a second opening therein that exposes a first portion of the substrate, a first sidewall spacer on the first gate electrode, a second sidewall spacer on the second gate electrode and an upper surface of the second gate electrode, using the second electrically insulating layer as an etching mask;

lining sidewalls of the first and second openings, the first and second sidewall spacers, the exposed first portion of the substrate and the exposed upper surface of the second gate electrode with an electrically insulating protective layer comprising the second material;

removing a portion of the electrically insulating protective layer from between the first and second gate electrodes to expose the first portion of the substrate; and filling the second opening and at least a portion of the first opening with an electrically conductive material.

2. The method of claim 1, wherein the second electrically insulating layer comprises silicon nitride.

3. The method of claim 2, wherein the first electrically insulating layer comprises silicon oxide.

4. The method of claim 1, wherein said filling comprises filling the second opening and the first opening with a metal interconnect that contacts the first portion of the substrate.

5. The method of claim 1, further comprising forming a source/drain diffusion region in the substrate, between the first and second gate electrodes; and wherein said filling comprises filling the second opening and the first opening with a metal interconnect that contacts the source/drain diffusion region.

6. The method of claim 1, wherein said forming first and second sidewall spacers is preceded by implanting first source and drain region dopants into the substrate using the first and second gate electrodes as an implant mask; and wherein said covering the first and second gate electrodes is preceded by implanting second source and drain region dopants into the substrate using the first and second gate electrodes and the first and second sidewall spacers as an implant mask.

7. A method of forming an integrated circuit device, comprising:

forming a gate electrode on a substrate;

forming sidewall spacers on opposing sidewalls of the gate electrode;

covering the gate electrode with a first electrically insulating layer of a first material;

depositing a second electrically insulating layer of a second material on the first electrically insulating layer;

patterning the second electrically insulating layer to define a first opening therein that exposes a first portion of the first electrically insulating layer;

selectively etching the first portion of the first electrically insulating layer to define a second opening therein that exposes a first portion of the substrate, a sidewall spacer on the gate electrode and an upper surface of the gate electrode, using the patterned second electrically insulating layer as an etching mask;

lining sidewalls of the second opening, the exposed first portion of the substrate, the sidewall spacer and the upper surface of the gate electrode with an electrically insulating protective layer comprising the second material;

removing a portion of the electrically insulating protective layer in the second opening to expose the first portion of the substrate and the upper surface of the gate electrode; and filling the second opening and at least a portion of the first opening with an electrically conductive material that contacts the upper surface of the gate electrode.

8. The method of claim 7, wherein said removing comprises etching the electrically insulating protective layer to form protective spacers on sidewalls of the first opening in the second electrically insulating layer.

9. The method of claim 8, wherein the first material comprises silicon dioxide and the second material comprises silicon nitride.

10. The method of claim 9, wherein said filling comprises filling the second opening and the first opening with a metal interconnect that contacts the upper surface of the gate electrode.

11. The method of claim 7, wherein said forming sidewall spacers is preceded by implanting first source and drain region dopants into the substrate using the gate electrode as an implant mask; and wherein said covering the gate electrode is preceded by implanting second source and drain region dopants into the substrate using the gate electrode and the sidewall spacers as an implant mask.

* * * * *